(12) United States Patent
deVilliers et al.

(10) Patent No.: US 9,977,339 B2
(45) Date of Patent: *May 22, 2018

(54) SYSTEM AND METHOD FOR SHIFTING CRITICAL DIMENSIONS OF PATTERNED FILMS

(71) Applicant: Tokyo Electron Limited, Minato-ku, Tokyo (JP)

(72) Inventors: Anton J. deVilliers, Clifton Park, NY (US); Daniel Fulford, Meridian, ID (US)

(73) Assignee: TOKYO ELECTRON LIMITED, Tokyo (JP)

(*) Notice: Subject to any disclaimer, the term of this patent is extended or adjusted under 35 U.S.C. 154(b) by 0 days. days.

This patent is subject to a terminal disclaimer.

(21) Appl. No.: 14/603,595

(22) Filed: Jan. 23, 2015

(65) Prior Publication Data

US 2015/0212421 A1 Jul. 30, 2015

Related U.S. Application Data

(60) Provisional application No. 61/932,005, filed on Jan. 27, 2014.

(51) Int. Cl.
*G03F 7/20* (2006.01)

(52) U.S. Cl.
CPC ...... *G03F 7/70616* (2013.01); *G03F 7/70425* (2013.01)

(58) Field of Classification Search
CPC .................................................. G03F 7/2022
See application file for complete search history.

(56) References Cited

U.S. PATENT DOCUMENTS

| 5,308,744 | A | 5/1994 | Koes |
| 5,646,870 | A | 7/1997 | Krivokapic et al. |
| 5,655,110 | A | 8/1997 | Krivokapic et al. |
| 6,605,394 | B2 | 8/2003 | Montgomery et al. |
| 7,150,949 | B2 | 12/2006 | Askebjer et al. |
| 7,186,486 | B2 | 3/2007 | Walford et al. |
| 8,129,080 | B2 | 3/2012 | Fonseca et al. |
| 8,197,996 | B2 | 6/2012 | Fonseca et al. |
| 8,236,483 | B2 | 8/2012 | Ando et al. |
| 8,283,111 | B2 | 10/2012 | Fonseca et al. |
| 8,470,516 | B2 | 6/2013 | Allen et al. |
| 8,647,817 | B2 | 2/2014 | Dunn et al. |
| 2002/0182514 | A1 | 12/2002 | Montgomery et al. |
| 2005/0032002 | A1 | 2/2005 | Walford et al. |
| 2005/0053850 | A1 | 3/2005 | Askebjer et al. |
| 2006/0204903 | A1 | 9/2006 | Choi et al. |
| 2008/0081287 | A1 | 4/2008 | Endo et al. |
| 2010/0035192 | A1 | 2/2010 | Ando et al. |
| 2010/0068654 | A1 | 3/2010 | Fonseca et al. |
| 2010/0075238 | A1 | 3/2010 | Fonseca et al. |
| 2010/0119960 | A1 | 5/2010 | Fonseca et al. |
| 2011/0045387 | A1 | 2/2011 | Allen et al. |
| 2011/0147984 | A1* | 6/2011 | Cheng ............... B82Y 10/00 264/220 |
| 2012/0009795 | A1 | 1/2012 | Endou et al. |
| 2012/0214099 | A1* | 8/2012 | Chen .................. G03F 7/0382 430/283.1 |
| 2013/0171571 | A1 | 7/2013 | Dunn et al. |
| 2014/0347643 | A1* | 11/2014 | Kotoku ............ G03F 7/70558 355/52 |
| 2015/0008211 | A1 | 1/2015 | Takano et al. |

FOREIGN PATENT DOCUMENTS

| JP | 2007-501431 | 1/2007 |
| JP | 2008-089952 | 4/2008 |
| JP | 2010-040849 | 2/2010 |
| JP | 2013-210411 | 10/2013 |
| TW | 2003-03573 | 9/2003 |
| TW | 2007-02913 | 1/2007 |

(Continued)

OTHER PUBLICATIONS

International Patent Application No. PCT/US2015/012592, "International Search Report and Written Opinion," dated Apr. 30, 2015, International Filing Date Jan. 23, 2015.
International Preliminary Report on Patentability issued in International Application No. PCT/US2015/012592 dated Aug. 2, 2016.
Notification of Examination Opinions issued in Taiwanese Application No. 104126024 dated Jul. 26, 2016 (with English Translation).
International Search Report issued in International Application No. PCT/US2015/043433 dated Oct. 29, 2015.
Written Opinion issued in International Application No. PCT/US2015/043433 dated Oct. 29, 2015.
S. Tagawa et al., "Super High Sensitivity Enhancement by Photo-Sensitized Chemically Amplified Resist (PS-CAR) Process", Journal of Photopolymer Science and Technology, vol. 26, No. 6 (2013), pp. 825-830.

(Continued)

*Primary Examiner* — Kathleen Duda
(74) *Attorney, Agent, or Firm* — DLA Piper LLP US

(57) ABSTRACT

Techniques herein include systems and methods that provide a spatially-controlled projection of electromagnetic radiation, such as light, onto a substrate as a mechanism of controlling or modulating critical dimensions of various features and structures being micro-fabricated on a substrate. Combining such spatial light projection with photolithographic exposure can achieve significant improvements in critical dimension uniformity across a surface of a substrate. In general, methods herein include patterning processes that identify or receive a critical dimension signature that spatially characterizes critical dimension values that correspond to the substrate. A pattern of electromagnetic radiation is projected onto a patterning film coated on substrate using a digital pixel-based projection system. A conventional photolithographic exposure process is executed subsequent to, or prior to, the pixel-based projection. The patterning film can then be developed to yield a relief pattern having critical dimensions shaped by both exposure processes.

20 Claims, 5 Drawing Sheets

(56) References Cited

FOREIGN PATENT DOCUMENTS

TW       2007-17180       5/2007

OTHER PUBLICATIONS

English Language Abstract and English Language Translation of JP 2010-040849 published Feb. 18, 2010.
English Language Abstract and English Language Translation of JP 2013-210411published Oct. 10, 2013.
English Language Abstract and English Language Translation of JP 2008-089952 published Apr. 17, 2008.
English Language Abstract TW 2003-03573 published Sep. 1, 2003.
English Language Abstract TW 2007-17180 published May 1, 2007.
English Language Abstract TW 2007-02913 published Jan. 16, 2007.
U.S. Appl. No. 14/816,587.

* cited by examiner

SYSTEM AND METHOD FOR SHIFTING CRITICAL DIMENSIONS OF PATTERNED FILMS

CROSS REFERENCE TO RELATED APPLICATIONS

The present application claims the benefit of U.S. Provisional Patent Application No. 61/932,005, filed on Jan. 27, 2014, entitled "System and Method for Shifting Critical Dimensions of Patterned Films," which is incorporated herein by reference in its entirety.

BACKGROUND OF THE INVENTION

This disclosure relates generally to patterning of substrates including semiconductor substrates such as silicon substrates. This disclosure also relates to processes involved with photolithography including coating and developing films on substrates as part of semiconductor device fabrication. This disclosure particularly relates to controlling dimensions and accuracy of patterned features as part of photolithography and patterning processes.

Photolithography involves coating substrates with films that are sensitive to electromagnetic (EM) radiation, exposing these films to a pattern of a EM radiation to define a latent pattern within the film, and then developing away some of the film to reveal a physical or relief pattern on the substrate. Preparation and development of such films can include thermal treatment or baking. For example, a newly applied film can require a post-application bake (PAB) to evaporate solvents and/or to increase structural rigidity or etch resistance. Also, a post-exposure bake (PEB) can be executed to set a given pattern to prevent further dissolving. Fabrication tools for coating and developing substrate typically include many modules that can be used to add film, add resist, and develop a substrate.

SUMMARY

In a conventional patterning process, a photolithography scanner exposes light (e.g. 193 nm) onto a mask or reticle such that a substrate coated with photoresist is exposed to a pattern of light. The photoresist can include additives to enable solubility shifting. These additives can include a photoresist acid generator (PAG) distributed evenly within the resist. The PAG in the photoresist reacts with the 193 nm light (or other selected light wavelength) and creates acid that chemically allows the reacted areas of the substrate to be developed or removed thereby creating a relief pattern having, for example, nanometer size structures made of the photoresist that remain on the substrate.

Conventional photolithographic exposure techniques, however, are not perfect. For example, features and structures created can have undesirable critical dimensions (CDs) or variations in CDs that are not desirable or within specified tolerances. Such undesirable CDs can cause device defects or otherwise compromise performance. Processes and systems herein, however, provide techniques that yield desirable CDs from microfabrication patterning processes.

Techniques herein include systems and methods that provide a spatially-controlled projection of light or electromagnetic radiation (EMR) onto a substrate. This spatially-controlled light projection can selectively activate a portion of photoresist acid generators as either a pre-exposure dose or a post-exposure dose to fine tune critical dimensions created by a scanner, stepper, or other reticle-based exposure system. Combining such spatial light projection with lithographic exposure can achieve significant improvements in critical dimension uniformity across a surface of a substrate. Light projected can be of any wavelength such as 172 nm laser, 400-700 nm light, Ultra Violet Light (UV), Extreme Ultraviolet Light (EUV), Infrared light, 13.4 nm radiation, etc. A given projected image can comprise multiple intensities and various wavelengths or a substantially same wavelength, which can be set to change and maintain many different steady state conditions on multiple substrates simultaneously. In other words, a combination of a pre/post exposure pixel-based electromagnetic radiation treatment (projected image) in combination with lithographic reticle-based exposure can correct feature dimensions that would otherwise be unacceptable or cause defects.

In one embodiment, a projector system is configured to direct electromagnetic radiation onto a substrate in a given pixel-based pattern such as by using a micro-mirror array. The pixel-based pattern of electromagnetic radiation projected onto a substrate (at least a portion is irradiated) can be based on a substrate critical dimension (CD) signature identified from observation, testing and/or other feedback/feedforward information. The substrate thereby receives a modulated PAG activating exposure with high spatial resolution and with any number of electromagnetic radiation intensities and patterns supported by a given pixel grid, micro-mirror array, etc. The patterned irradiation spatially modify photoresist acid content in a given photoresist film. Thus, an EMR projection can be controlled by pixel or spot (point location on a substrate).

The projected pattern of EMR can be tailored to specific results desired. For example, increasing or decreasing critical dimensions, facilitating edge bead removal, alignment mark reveal, EUV flare compensation, and so forth. Thus, a combination of fine and coarse control for a CD control can provide dramatically better uniformity and improve yield. Because light can alter material properties of certain materials (such as photoresists), existing exposures can be augmented to be biases up or down.

By way of a specific, non-limiting example, a projection system projects a pattern of EMR using a 172 nm laser or infrared laser the Critical Dimensions (CD) of a substrate can be changed to meet an engineer's needs by adding this process to the recipe queue. The 172 nm laser or infrared laser activates PAG anywhere on the substrate within the diameter of the 172 nm laser or infrared laser resolution. After running a substrate through a recipe any CDs that are out of required parameters can be recorded and then those CD corrections can be inputted into a new recipe with the addition of the critical dimension shifting process as described herein. This shifting process can be added before a primary exposure process (mask-based) or after the primary exposure process. As a new substrate is treated with pre-exposure techniques herein, the CD will be shifted in a specified region and the remaining recipe can be followed with the new CDs. This process allows for finer tuned results than is conventionally possible. Being able to adjust a CD of a substrate will increase efficiency and reduce semiconductor fabrication costs.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Figure 1:
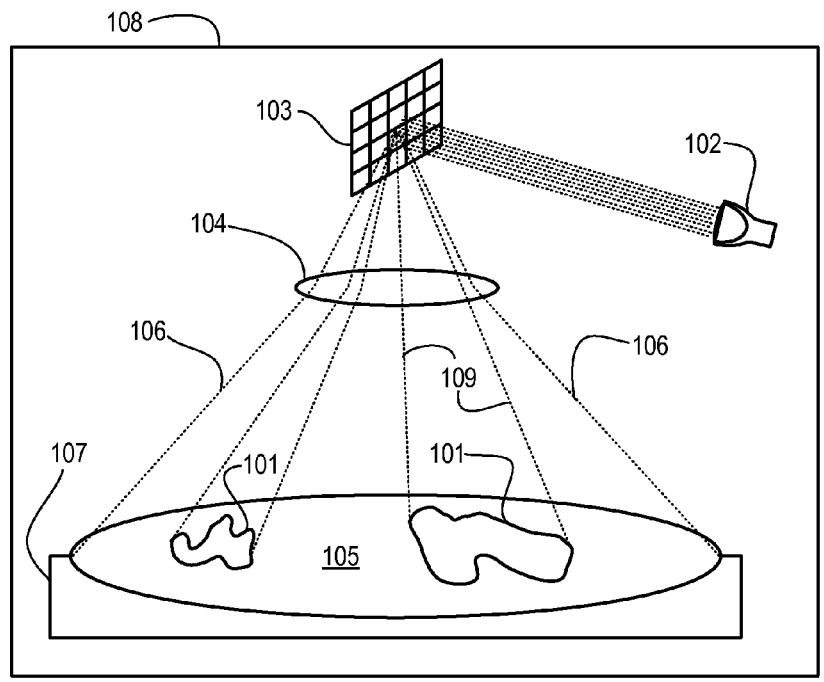
FIG. 1 is a schematic perspective illustration of an example image projection system for tuning a substrate.

Techniques herein include systems and methods that provide a spatially-controlled projection of electromagnetic radiation, such as light, onto a substrate as a mechanism of controlling or modulating critical dimensions of various features and structures being micro-fabricated on a substrate. Combining such spatial light projection with photolithographic exposure can achieve significant improvements in critical dimension uniformity across a surface of a substrate. In general, methods herein include patterning processes that identify or receive a critical dimension signature that spatially characterizes critical dimension values that correspond to the substrate. A pattern of electromagnetic radiation is projected onto a patterning film coated on substrate using a digital pixel-based projection system. A conventional photolithographic exposure process is executed subsequent to, or prior to, the pixel-based projection. The patterning film can then be developed to yield a relief pattern having critical dimensions shaped by both exposure processes.

The process of semiconductor manufacturing includes several steps. The limit of process size on each step is constrained by a critical dimension (CD) because a substrate's CD is considered to be as large as the largest deviation on the entire substrate. During a lithographic developing step, all de-protected (soluble) resist is removed. Resist materials become de-protected as acid inside a given resist increases. This means more material will be removed from the resist. For example when more acid is activated, then more area is removed and the remaining structure is smaller and finer. This change in size of a gap decreases the CD of the created structure. As the photons hit a resist film, a photo acid generator (PAG) is activated which releases acid into the resist. Various frequencies of electromagnetic radiation (EMR) or light can activate a given PAG. By way of a non-limiting example, a 172 nm laser or an infrared laser can activate a given PAG on a target area in a resist intended for 193 nm or 13.4 nm EMR. A pre-exposure with 172 nm can add an amount of acid up to 0.001-10% (or more) of the original 192 nm exposure or the EUV 13.4 nm exposure because the photoresist reacts differently to 172 nm light. This pre-exposure increases the total acid production in the resist from 100% of the primary exposure to 100.001%-110.000% after both exposures are combined, or, rather, after the effect of both exposures are combined. The size of the CD can be finely controlled by the amount of acid released into the resist. Multiple lasers can be used simultaneously and the target areas can be changed to dose only areas on a substrate in which manipulating the CDs is desirable.

Continuing this example, with the pre-exposure process herein, a CD on a given substrate can be reduced down to within limits of a 172 nm laser or infrared laser. Adjusting the precision of acid released into the resist allows the CDs on the substrate to be individually tuned and can decrease an overall substrate CD. Reducing the overall CD on a substrate allows an engineer to more finely tune the semiconductor manufacturing process. Conventionally, various processes run during semiconductor manufacturing can create different CDs on different portions of a substrate, but these CD differences or variations can predictable and consistent. For example, it is typical for a specific lithography tool (or set of systems) to consistently generate a first CD signature, while a different lithography system consistently generates a second substrate CD signature. Because locations of the CDs are predictable, a compensating image or pattern can be created to lower a high CD or raise a low CD. This critical dimension shifting process can be added to any engineering recipe as many times as needed to shift all CDs in a given substrate and produce CDs as specified.

In one embodiment, a digital light processing (DLP) chip, grating light valve (GLV), or other micro projection technology, with a light source can focus an image or pattern (optionally using a lens) onto a substrate and correct or adjust critical dimension non-uniformities. In other words, critical dimensions can be shifted to be larger or smaller on specific parts of a substrate. This image or pattern projection provides a fine tune control mechanism that, when coupled with conventional photolithographic exposure processes, yields uniform CDs on substrates treated with digital light projection. The projected pattern essentially provides a relatively small pre-dose or post-dose (small compared to lithographic exposure) that compensates for repeating non-uniformities produced from a given photolithographic exposure system, tool, or combination of systems.

The image or projected pattern can be changed based on changing critical dimension signatures. For example, projecting light or EMR, such as ultraviolet (UV), deep ultraviolet (DUV), extreme ultraviolet (EUV), etc., on a radiation sensitive material can change a solubility of that material. Any given solubility change can be dependent on a type of material. For example, the solubility change can make an initially insoluble material become soluble, or make an initially soluble material become insoluble. An amount or intensity of EMR can be adjusted per projected pixel or point of light. Thus, at projection points receiving a full intensity available from a given light source, a maximum amount of solubility change can happen. At projection points on a substrate receiving no EMR, no differential change in solubility will occur. Such a technique gives extremely precise control over an exposure process. After a radiation-sensitive film on a substrate is exposed to the pattern of EMR, the radiation-sensitive film is thereby pre-conditioned or pre-biased so that after receiving (imperfect) lithographic exposure, the aggregate exposure received across the substrate is uniform or meets design specifications. Upon developing the twice-exposed film, resultant CDs are uniform across the substrate. A DLP chip can be used project an image/pattern onto the substrate for this critical dimension shifting.

A projected image as disclosed herein, however, can vary light/EMR output to every individual atom depending on the number of pixels supported by a given DLP and by the incident area. That is, CD adjustment control available from using micro projection can be as flexible or as fine-tuned as its maximum projected resolution.

In one embodiment, a pixel-based light projection system is connected to a control computer of a lithography device, such as a coater/developer tool or a scanner/stepper tool. The DLP can be focused through a lens system into an exposure chamber where a substrate is aligned. Light projected onto or at the substrate then activates a PAG at desired areas of the substrate to a desired solubility change.

FIG. 1 illustrates an example embodiment of a critical dimension shifting system using optical projection. Processing chamber 108 can be sized for receiving a substrate, such as a silicon wafer, flat panel, etc. Processing chamber 108 can be a relatively minimum size (based on a size of the substrate) for protection from hazardous light wavelengths. A substrate alignment system 107 can be used to align an image onto a workable area on the substrate, which can be within 0.1 nanometers. Substrate 105 can be positioned on a substrate holder. Substrate 105 can be a conventional reflective or non-reflective silicon disk with any type of coating.

The system includes light source 102 which can be located within, adjacent to, or remote from the processing chamber 108. Light source 102 can be any of visible light, infrared, UV, or any other wavelength from a bulb, laser, or other source. For example, the light source can be a 172 nm laser or infrared laser or any other wavelength that can change properties of a corresponding resist or activate corresponding PAGs. A laser beam can be a collimated high intensity beam to more efficiently heat and treat. Light source characteristics can be tailored to a particular substrate being treated. For some substrates a 60 Watt light source may be sufficient, with a wavelength range of 400-700 nm, and a DLP resolution of 1080p. Other applications may require higher power and higher resolution and a DLP capable of reflecting UV and DUV light without overheating. The light source can be selected based on wavelength. For example an ultraviolet light source can be selected for certain applications, while a white or infrared source can be selected for other applications. Light source selection can be based on the absorption characteristics of a particular substrate and/or film. Any resolution can be used that is supported by the DLP, GLV, or other light valve technologies.

Light projection device 103 can be a DLP chip, Grating light valve (GLV) or other light valve technology. Lens system 104 can be used to produce an image the size of the substrate onto the substrate with minimal aberrations. Item 106 identifies an image being projected toward substrate 105. Items 101 show example locations on substrate that have non-uniform CDs. Projected image 109 projects light in the shape of one of items 101 as a pre-dose.

Such a system combines a fine and coarse control system for CD control. Conventional lithographic exposure is thus augmented with high location resolution capability from a DLP system. Every location that a projected pixel can be projected on or off becomes an area that can have fine tuning for CD shifting.

Figure 2:
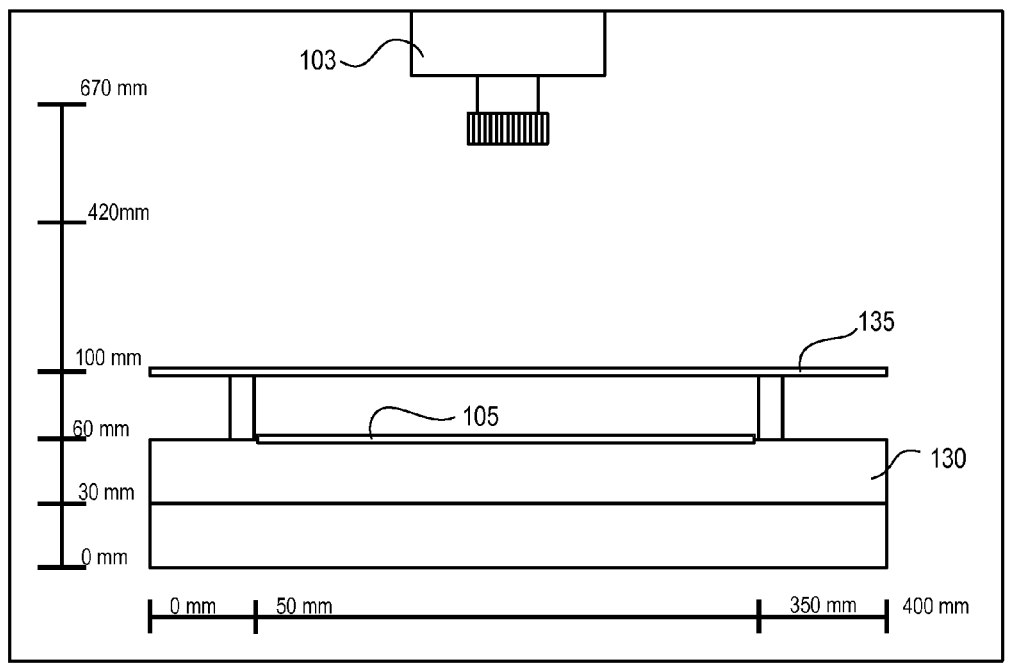
FIG. 2 is a schematic side view of an example image projection system for tuning a substrate.

FIG. 2 is a side-view diagram of an example system for improved substrate processing. A substrate 105 rests on a substrate holder 130, which can be embodied as, or include, a chuck or heat chuck. Above substrate 105 (that is, facing a substrate side being treated) a DLP projector or the like can be positioned to project an image onto a substrate surface as part of light projection device 103. The location of the projector can vary based on space availability within a given chamber. For example, many modules of microfabrication tools are relatively short. In these embodiments, various apertures 135 and/or lens systems can be used to project an image within any limited vertical space above the substrate. Example height and width measurements are shown, but these are non-limiting and just to illustrate one particular embodiment.

Purpose-built light projection systems can be manufactured for use in such substrate tuning and/or heating modules. Alternatively, conventional DLP projectors can be used. For conventional DLP projector use, removing a color filter can increase light (heat) intensity available for projection on each substrate location. In many light projectors, white light generated by a light source passes through a color filter as the white light travels to the surface of a DLP chip. This means that most of the wavelengths are being absorbed before leaving the projector. In addition to removing any color filters, lamp intensity can also be increased according to particular design specifications.

Other embodiments can use different wavelength lamps or lasers for light projection on to a single substrate. These lamps can all contribute to light projection, or be selectively activated. Likewise, multiple projectors per substrate can be used. In other embodiments, light projection can have a frequency-based output for finer tuning, such as with 3D applications. A given light image projected onto a substrate can be based on intensity (amplitude) and/or frequency (on and off). Available DLP mirrors can be switched on and off up to ten thousand times per second. With full light intensity projected on a given spot there will be an increase in photo acid generation that is 100% of the possible solubility change available based on a given lamp intensity and based on type of material being exposed. If finer control of light projection is desired, then intensity projection can be combined with frequency-based projection.

The CD shifting techniques herein can be added to typical semiconductor manufacturing flow. For example, a substrate is manufactured and then a thin film is added using a coater/developer tool, which is sometimes referred to as a track tool. Then a photoresist coating is added. The critical dimension shifting process is then executed at this point. Conventional lithographic exposure is executed via a scanner tool, and then a developer removes soluble material. Note that there can be one or more bake steps to treat the radiation-sensitive film either before or after the lithography scanner exposure. After developing, the substrate can continue with conventional fabrication steps of etching, testing, cutting and packaging. Alternatively, a critical dimension shifting process step can be inserted after executing conventional lithographic exposure.

Figure 3:
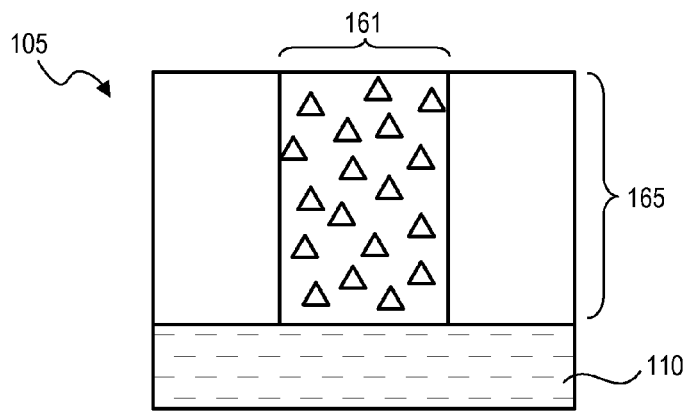
FIGS. 3-5 are schematic side views of an example substrate segment showing an exposure process with radiation sensitive material.
Figure 4:
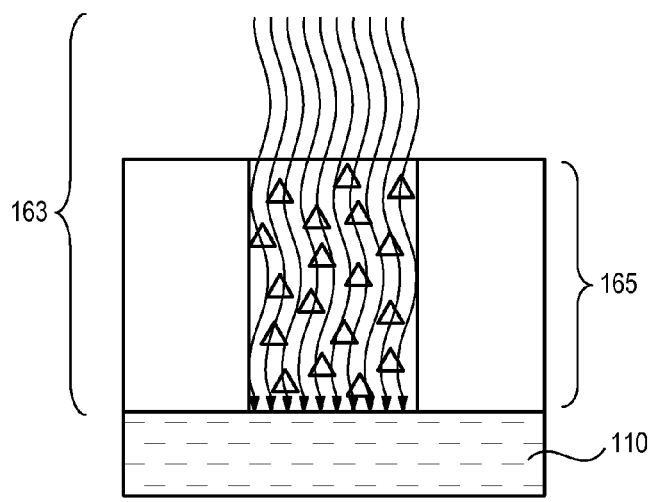
Figure 5:
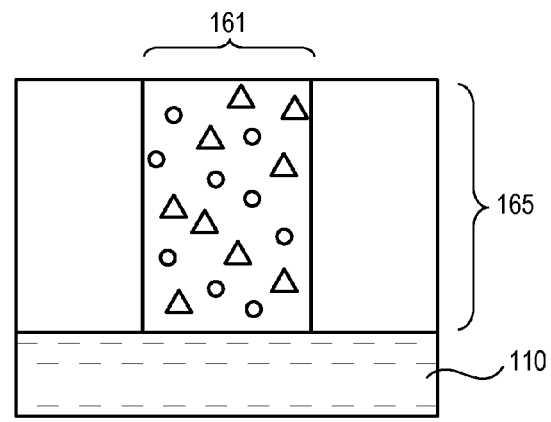

FIGS. 3-5 illustrate effects of either a conventional exposure process or a pixel-based exposure process as described herein. In FIG. 3, a resist 165 is coated on an underlying layer 110 of a substrate 105. The resist includes a photo acid generator represented by triangles, within target exposure area 161, which can be what a mask or reticle will allow to be exposed, or what will be exposed via digital light projection. FIG. 4 illustrates an exposure wave 163 traveling though the target exposure area 161. This actinic radiation interacts with the PAG creating acid represented by circles as shown in FIG. 5. The target exposure area 161 now includes some acid (or photo-destructive base) which changes a solubility of the resist to enable removal using one or more solvents. The amount of acid can be more or less depending on the type of exposure. For example, digital light projection may generate less acid as compared to photolithographic exposure, but a combined amount of acid created results in a specified exposure dose.

Figure 6:
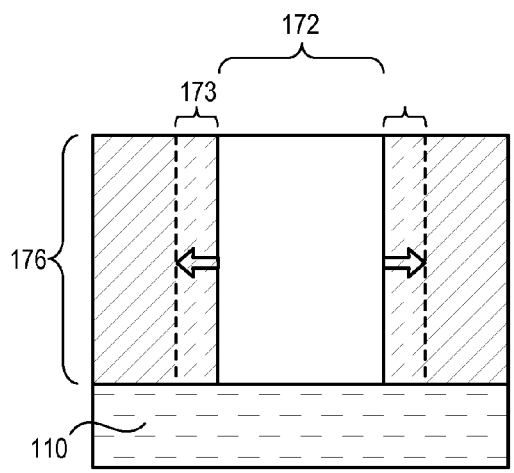
FIGS. 6-7 are diagrams of an example substrate segment illustrating CD modification by augmentation.
Figure 7:
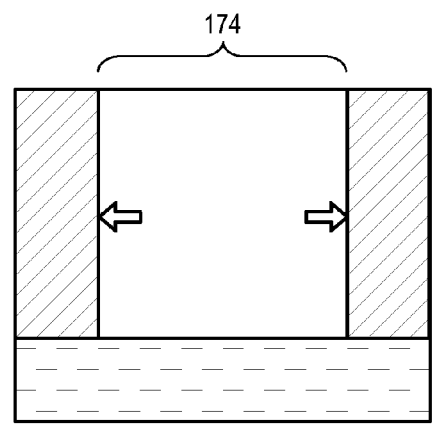

FIGS. 6-7 illustrate CD modification or shifting by augmentation such as when using a positive tone develop (PTD) resist. FIG. 6 shows a size of line 172 prior to CD shifting. Shaded area 173 identifies a change in size that will occur after completion of the CD shifting process of a patterning layer deposited on top of a substrate and any accompanying thin films. Line 172 is what a conventional lithographic exposure (scanner using a mask) would produce. Prior to lithographic exposure (or subsequent to), however, the resist layer 176 is exposed to a spatial pattern or image projected via a digital pixel-based projection system, such as a micro-mirror device. This augmenting exposure can differentially pretreat locations on a substrate based on a CD signature of the substrate. This means that some point locations will receive a high dose of light, while other points on the substrate may receive no activating light. When combined with lithographic exposure, the initial line is expanded to line size 174, thereby increasing or augmenting a CD.

Figure 8:
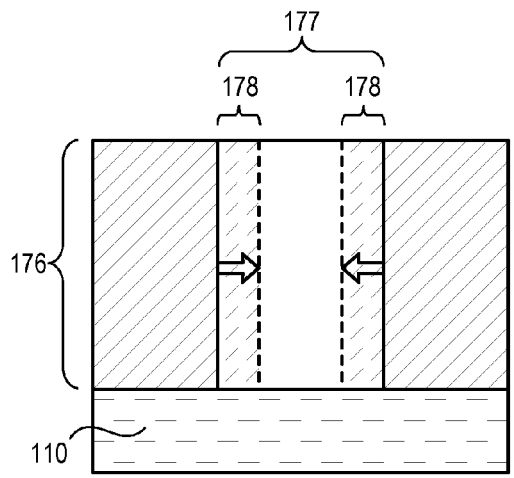
FIGS. 8-9 are diagrams of an example substrate segment illustrating CD modification by reduction.
Figure 9:
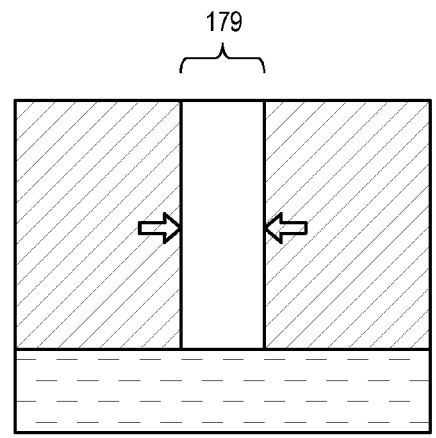

FIGS. 8-9 illustrate CD modification or shifting by shrinking, such as when using a negative tone develop (NTD) resist. FIG. 8 the left shows a size of line 177 prior to CD shifting. Areas 178 identify a change in size that will occur after completion of the CD shifting process of a patterning layer deposited on top of a substrate and accompanying thin films. Line 177 is what a conventional lithographic exposure (scanner using a mask) will produce. Prior to lithographic exposure (or subsequent to) the resist layer is exposed to a spatial pattern or image projected via a digital pixel-based projection system, such as a micro-mirror device. This reducing exposure can differentially pretreat locations on a substrate based on a CD signature of the substrate. This means that some point locations will receive a high dose of light, while other points on the substrate may receive no activating light. When combined with lithographic exposure, the line 177 is reduced from an initial size to a resultant size as in line 179, thereby decreasing a CD.

Thus, techniques herein can deliver either a pre-dose or an augmented post dose. This supplementary dosing shifts a dose delivered lithographically overall. A scanner or other lithography exposure tool in the majority of process flows supplies most of the actinic radiation, while the pixel-based adjustment herein provides a remaining exposure or fine tuning work. Thus, CDs can be finely adjusted via a raster-based scan and radiation treatment. Techniques include an augmented pre-exposure, prior to a final (lithographic) exposure, such that photo acid is recorded in film. The photo acid in the film then biases the total CDs of the system.

Conventionally, semiconductor fabricators must rely on a dose mapping scheme to correct intra-field CD variation. Dose mapping uses substrate feedback to the scanner to correct for errors such as uncorrected illumination, non-uniformities, and projection lens aberration. Dose mapping processes, however, are expensive and time consuming. Techniques herein can either complement or entirely replace dose mapping hardware and processes. Moreover, changing a wavelength will create a fine dose controller that can pre-dose the substrates with a CD correction that will only show up as a correction after develop, which embodiment essentially provides a significantly improved version of a Dose Mapper (DOMA).

Figure 10:
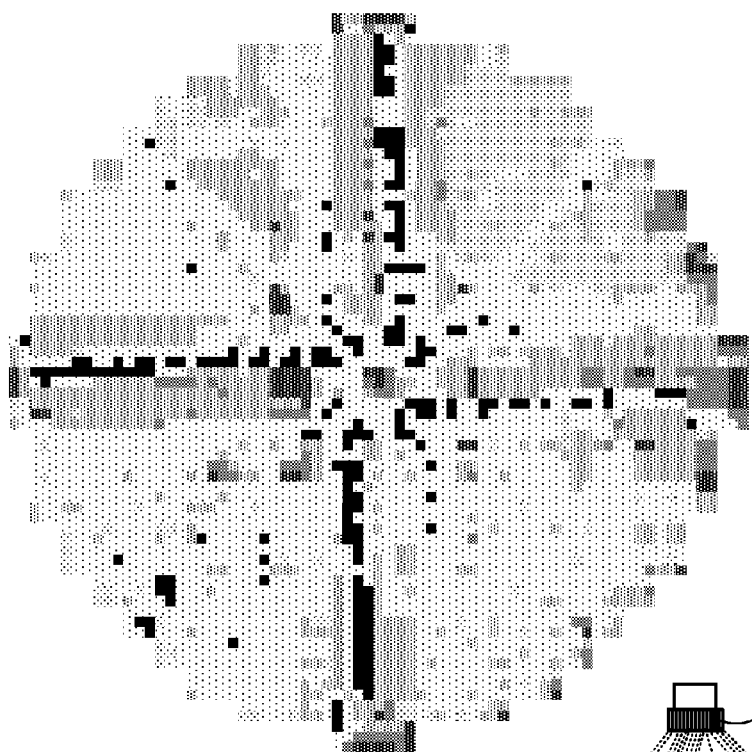
FIG. 10 is an illustration representing an example critical dimension signature of an example substrate.

One embodiment herein includes a method for patterning a substrate. The method comprises identifying a critical dimension signature that spatially characterizes observed critical dimension values of structures on substrates corresponding to a substrate to be processed. This can include receiving a critical dimension signature from a third party or from an analysis system that has measured and mapped CDs on a representative substrate having been processed by a particular photolithography system. Conventional lithography systems typically produce some non-uniformities, but these non-uniformities repeat from substrate to substrate such that there is a CD signature that repeats from substrate to substrate processed by a particular lithography system (which can be a tool or set of tools/materials). In other words, there are typically specific areas on a substrate that have lower yield because CDs in that area are either too small or too big. Locations of CD variations can be randomly distributed across a substrate surface, and/or be a result of a stepper sequence, etc. FIG. 10 is a graphical representation of an example critical dimension signature. Substrates are typically planar and thus CD uniformity fluctuations can vary based on planar or X, Y, location on a substrate. This critical dimension signature is mapped as point locations on the surface of a given substrate such as a wafer used in microfabrication processes. Note that various points on the CD signature illustration vary in degree of darkness or lightness. These relative differences at point locations on the CD signature illustration represent relative differences in CD uniformity. For example, point locations that are completely darkened can represent areas having CDs that are too small, whereas point locations that are completely lightened or lighter can represent areas having CDs that are too large. This CD signature can be generated based on observed and/or measured dimensions.

In some embodiments, the critical dimension signature identifies variations in critical dimensions corresponding to physical locations on a representative substrate that has been processed by a specific photolithography exposure system, as these variations can be repeating.

A substrate (to be processed) is coated with a patterning film. The patterning film is at least initially radiation-sensitive in that a solubility of the patterning film is changeable by exposure to actinic radiation. For example, this patterning film can be a resist (photoresist) or similar material. The radiation sensitivity can be later removed by baking the material or otherwise treating it. Thus the patterning film may not always remain radiation-sensitive. The patterning film itself can be inherently sensitive to light/radiation, or can be made sensitive such as by the addition of photo acid generators or other solubility changing agents.

Figure 11:
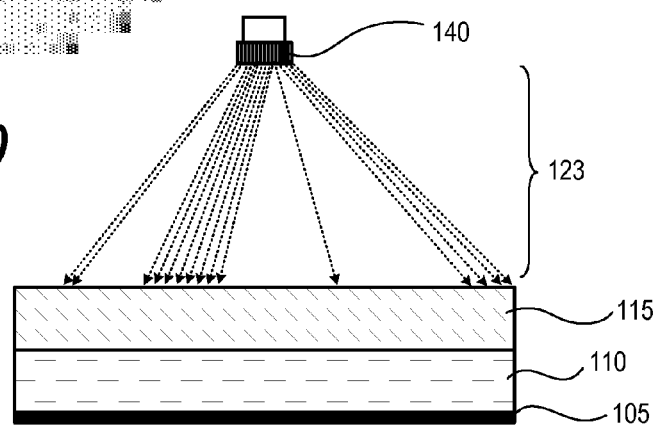
FIGS. 11, 12, 13A, 13B, 14A, 14B, 15A, and 15B are cross-sectional schematic views of an example substrate segment showing a process flow according to embodiments disclosed herein.

Referring now to FIG. 11, a pattern of electromagnetic radiation (EMR) is projected onto the patterning film 115 coated on the substrate 105 (typically upper surface of the substrate), which can include underlying layer 110. The pattern of electromagnetic radiation is projected using a digital pixel-based projection system 140 having an array of independently addressable projection points, as shown in FIG. 11. The projected pattern 123 is based on the critical dimension signature. Note that the projected pattern can vary based on point location on the substrate. The CD signature can be a representation or measure of which areas on a substrate are receiving too little exposure and which areas are receiving too much exposure by scanner lithographic exposure. By spatially knowing this exposure data, and projection pattern can be determined. Accordingly, at point locations which could benefit from more exposure, those point locations receive more exposure from the digital pixel-based projection system to compensate for under exposure by a particular scanner. Likewise, at point locations receiving too much exposure from a scanner, these point locations would receive little or no exposure from the digital pixel-based projection system. There can be any number of gradient exposures in between. The projected pattern is essentially a projected image or grid-based array of light projection points. Each light point can be projected on to a two-dimensional surface location of a substrate. In many embodiments for photo acid generation, however, the electromagnetic radiation can be far below the visible spectrum and far into deep ultraviolet or extreme ultraviolet light and thus there would be no image capable of being visibly perceived. Various embodiments can project this pattern using a micro-mirror device, which is a device having an array of individually moveable mirrors. A conventional Digital Light Processing (DLP) chip can be used for electromagnetic radiation within about the visible spectrum and into the UV spectrum. For projecting UV light DUV, EUV, etc., then material modifications to a convention DLP chip prevent the higher energy/frequencies from destroying the DLP chip.

Projecting the pattern of electromagnetic radiation includes projecting electromagnetic radiation having a wavelength less than about 1000 nanometers, and can include the projected electromagnetic radiation having a wavelength less than about 200 nanometers. The digital pixel-based projection system can be configured to vary an amount of electromagnetic radiation projected by point location on the projected pattern. Using a digital pixel-based projection system includes using a micro-mirror projection device that reflects electromagnetic radiation onto the substrate from a light source. Such light projection causes photo acid to form in the patterning layer according to the pattern of electromagnetic radiation. The patterning layer can include a photo acid generator. Such projection can include varying light intensity by each independently addressable pixel. The projected image can be aligned with the spatial critical dimension signature.

Figure 12:
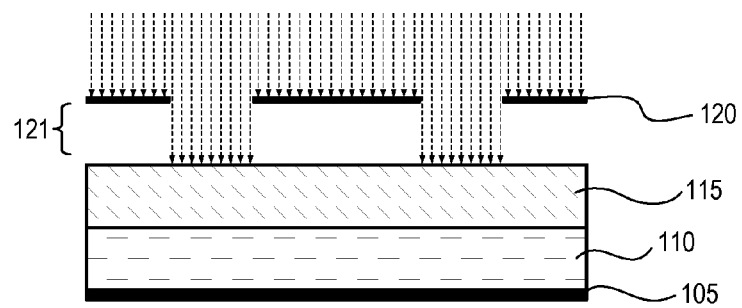
Figure 13A:
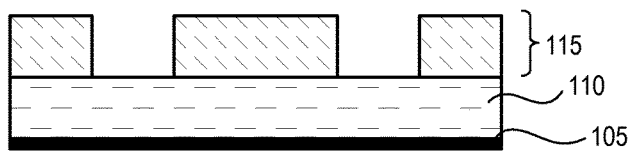
Figure 13B:
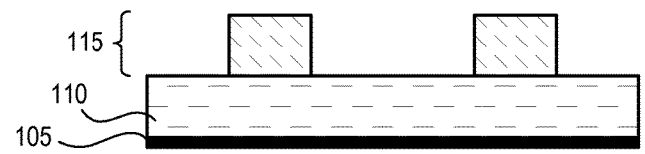
Figure 14A:
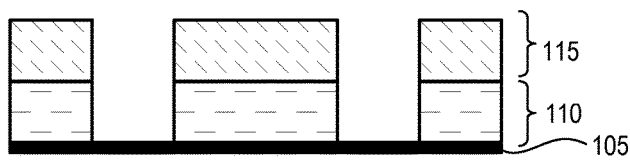
Figure 14B:
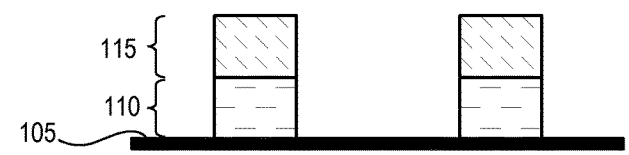
Figure 15A:
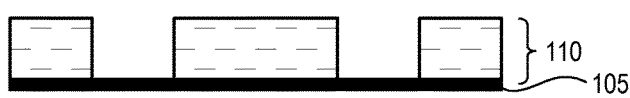
Figure 15B:
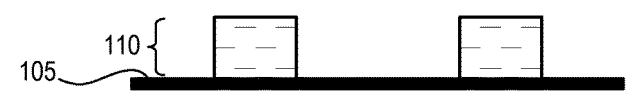

Subsequent to the substrate being processed via a photolithographic exposure—and pixel-based exposure—the patterning film is developed such that soluble portions of the patterning film are removed resulting in remaining portions of the patterning film forming a relief pattern on the substrate. FIG. 12 is an illustration of photolithographic exposure process in which a reticle 120 is used to mask light such that mask-based light pattern 121 affects portions of the patterning film 115. FIGS. 13A and 13B show results of a substrate after developing steps have been completed. FIG. 13A illustrates how exposed portions (from FIG. 12) are removed such that patterning film 115 defines a relief pattern. FIG. 13B shows the result of developing a reverse latent pattern in which unexposed portions are soluble and are removed by a developer, such as with using a negative tone developer. In either scheme, the resulting relief pattern can be used as a mask for transferring (etch transferring) a pattern into underlying layer 110, as shown in FIGS. 14A and 14B. FIGS. 15A and 15B show a result after having cleaned the patterning film 115.

In another embodiment, a method for patterning a substrate includes identifying a critical dimension signature that spatially characterizes critical dimension values of structures corresponding to a substrate to be processed. This critical dimension signature can come from a test substrate or previously processed substrates. An image is calculated based on the critical dimension signature. The image is projected onto a patterning film deposited on the substrate as a pattern of electromagnetic radiation and projected using a digital pixel-based projection system having an array of independently addressable projection points. Projecting the pattern of electromagnetic radiation can include projecting light onto the surface of the substrate via a digital light processing (DLP) device. Subsequent to the substrate being processed via a photolithographic exposure process, the patterning film is developed such that soluble portions of the patterning film are removed resulting in remaining portions of the patterning film forming a relief pattern on the substrate. An alternative embodiment can include executing a reticle-based photolithographic exposure process. The reticle-based photolithographic exposure process causing a second solubility shift in the patterning film. The first solubility shift and the second solubility shift combined define a latent pattern in the patterning film in that the latent pattern comprises portions of the patterning film that are soluble to a given developer. The reticle-based photolithographic exposure process can occur subsequent to, or prior to, projecting the image onto the patterning film using the digital pixel-based projection system.

A critical dimension modifying apparatus herein can include a substrate holder configured for holding a substrate with a patterning film. The patterning film being at least initially radiation-sensitive in that a solubility of the patterning film is changeable by exposure to radiation. This apparatus also includes a microprocessor configured to identify a critical dimension signature that spatially characterizes observed critical dimension values of structures on substrates having been processed by a specific photolithography exposure system. A digital pixel-based projection system (such as a DLP and/or micro-mirror device or GLV device) is also included and configured to project a pattern of electromagnetic radiation on the patterning film coated on the substrate. The digital pixel-based projection system has an array of independently addressable projection points such that the projected pattern can be based on the critical dimension signature. A developing module can be included and used to develop a latent pattern in the patterning film created by the specific photolithography exposure system executing a photolithographic exposure process. The developing module can be configured to remove soluble portions of the patterning film such that remaining portions of the patterning film form a relief pattern on the substrate. A light source can be included for projecting an image as a grid of points. A light filtration system can also be used to exclude specific wavelengths of light from being projected onto the patterning film on the substrate.

For uniform results, a pre-dosed substrate—dosed according to a predetermined spatial pattern—must be transferred to a same specific scanner or exposure tool from which a CD signature was created.

For example, in some scenarios, a given lithography scanner repeatedly under exposes a bottom portion of a substrate. In response to receiving or identifying this non-uniformity signature, a pixel-based projection of activating radiation can be executed to generate (prior to exposure) photo acid in that bottom portion (of this particular example substrate) to bias or help compensate for the under exposure of the lithography system in that particular bottom portion. In some embodiments this can mean increasing photo acid in a particular area by a single digit percentage, but this relatively small increase means that a uniform flood exposure by the scanner—when coupled with this pre-dose—results in bottom portion having a final CD that matches CDs of the rest of the substrate, thereby increasing yield. Note that a given CD signature can be field-based (die-base) and/or based on other variations and exposure nuances of each exposure system. Field-based patterns, for example, can be used correct EUV flare.

This pattern of EMR or pre-dose can be executed at a processing point somewhere between coating a substrate and lithographic exposure. In other embodiments, the pre-dose or fine tuning step can happen after lithographic exposure and before developing. Thus, all of the necessary hardware can be installed in a developing module, a lithography tool, or coating system. Compared to a post-exposure fine tuning, there are more advantages to fine tuning dosing prior to lithographic exposure. Usually directly after photo lithography there is a post exposure bake delay to stop further reactions, but delays prior to post exposure bake can create a CD shift making accurate fine tune dosing more complicated.

With techniques herein, however, a CD can be changed on any spot on any substrate by several to many nanometers by pixel-based projection of electromagnetic radiation. A digital light processing (DLP) chip and/or micro-mirror array can be used to project electromagnetic radiation onto a substrate surface and vary intensity by pixel or spot projection area on a substrate. This enables changing a CD on any spot on a substrate by just a few nanometers. A substrate CD signature can be determined by any feedback system. Techniques herein can thus provide a mask-less CD tuning technique.

In other embodiments, techniques herein can be used to spot clear out alignment targets and spot clear out for substrate edge (edge bead removal). A pre-dose can help mitigate 450 mm substrate post exposure bake deltas. With substantially larger substrates, and an exposure tool that individually steps through a grid of fields on a substrate, there is a lag time between a first field being exposed and a last field being exposed. This lag time can affect pattern and line uniformity. Biasing each field with a pre-dose amount, however, can compensate for the exposure time lag (raster delay). In another embodiment, higher resolutions and using a laser source of light can be used for clearing out layers to help with overlay. Projected images can also be used to define areas for directed self-assembly (DSA). Embodiments can also be used for edge placement error (EPE) tuning.

Projecting a CD-signature based image onto a substrate positioned in a processing chamber is just one embodiment of this technique. There are many additional applications and embodiments for treating substrates at various stages of semiconductor fabrication. Thus, applications are not limited to lithography. In other embodiments, light image projection can be used for both post application bake (PAB) and post exposure bake (PEB). Light image projection can be used for complex edge bead removal (EBR) clear outs—an area can be "drawn" or projected for edge bead removal. Light image projection can be used to define areas for directed self-assembly of block copolymers as a way to print an array. That is, exposure can be boosted sufficiently to where directed self-assembly (DSA) can print in an array, while remaining areas are not exposed so that the block copolymers will self-assemble without using a cut mask, which saves a process step.

Embodiments can be used herein with wet or dry substrate cleaning systems. With wet cleaning systems, the projected light image can assist with center-to-edge temperature uniformity. In some processes in which a liquid is dispensed on a spinning substrate, a thickness of a film is greater toward the center of a substrate as compared to the edge. Techniques herein, however, can help even radial temperature uniformity. Depending on location of dispense nozzles and arms, an image to that is projected may be essentially a pie-shaped image, but with a spinning substrate, all parts of the substrate can be irradiated. Projecting an image using UV light can further assist with reactivity of chemicals to improve radial reactivity of such chemicals as a spatial light augmentation technique that can be combined, for example, with a UV lamp directly provides most of the irradiation. Note that for UV light augmentation and projection, optics should be selected that enable UV transmission, such as quartz, calcium fluoride, or other transparent conducting media.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for patterning a substrate, the method comprising:
identifying a critical dimension signature that spatially characterizes observed critical dimension values of structures on substrates corresponding to a substrate to be processed as compared to predetermined feature dimensions;
coating the substrate with a patterning film, the patterning film being at least initially radiation-sensitive in that a solubility of the patterning film is changeable by exposure to actinic radiation;
projecting a pattern of electromagnetic radiation onto the patterning film coated on the substrate, the pattern of electromagnetic radiation being projected using a digital pixel-based projection system having an array of independently addressable projection points that are selectively addressed to form the projected pattern, the projected pattern being based on the critical dimension signature to compensate for at least one critical dimension value for at least one structure deviating from a predetermined feature dimension value for the at least one structure;
subsequent to the projecting and the substrate being processed via a photolithographic exposure process separate from the projecting, developing the patterning film such that soluble portions of the patterning film are removed resulting in remaining portions of the patterning film forming a relief pattern on the substrate.

2. The method of claim 1, wherein projecting the pattern of electromagnetic radiation includes projecting electromagnetic radiation having a wavelength less than about 1000 nanometers.

3. The method of claim 2, wherein the projected electromagnetic radiation has a wavelength less than about 200 nanometers.

4. The method of claim 1, wherein the critical dimension signature identifies variations in critical dimensions corresponding to physical locations on a representative substrate that has been processed by a specific photolithography exposure system.

5. The method of claim 1, wherein the digital pixel-based projection system is configured to vary an amount of electromagnetic radiation projected by point location on the projected pattern.

6. The method of claim 1, wherein using a digital pixel-based projection system includes using a micro-mirror projection device that reflects electromagnetic radiation onto the substrate from a light source.

7. The method of claim 1, wherein the patterning film includes a photo acid generator; and
wherein projecting the pattern of electromagnetic radiation onto the patterning film causes photo acid to form in the patterning film according to the pattern of electromagnetic radiation.

8. The method of claim 1, wherein projecting the pattern of electromagnetic radiation onto the patterning film provides a pre-dose of electromagnetic radiation prior to a receiving a mask-based lithographic exposure.

9. The method of claim 1, wherein projecting the pattern of electromagnetic radiation onto the patterning film provides a dose of electromagnetic radiation that is executed subsequent to a receiving a mask-based lithographic exposure.

10. The method of claim 1, wherein projecting the pattern of electromagnetic radiation includes projecting light onto the surface of the substrate via a digital light processing (DLP) device.

11. The method of claim 10, wherein the digital light processing device is configured to vary a light intensity of each independently addressable pixel.

12. A method for patterning a substrate, the method comprising:
identifying a critical dimension signature that spatially characterizes critical dimension values of structures on substrates corresponding to a substrate to be processed according to a predetermined pattern;
calculating an image based on the critical dimension signature to compensate for at least one critical dimension value for at least one structure deviating from a predetermined critical dimension value for the at least one structure and thereby form the predetermined pattern;
projecting the image onto a patterning film deposited on the substrate, the image being projected as a pattern of electromagnetic radiation and projected using a digital pixel-based projection system having an array of independently addressable projection points that are selectively addressed to form the projected pattern; and
subsequent to the projecting and the substrate being processed via a photolithographic exposure process separate from the projecting, developing the patterning film such that soluble portions of the patterning film are removed resulting in remaining portions of the patterning film forming a relief pattern on the substrate.

13. The method of claim 12, wherein the critical dimension signature identifies variations in critical dimensions corresponding to physical locations on a representative substrate that has been processed by a specific photolithography exposure system.

14. The method of claim 12, wherein the digital pixel-based projection system is configured to vary an amount of electromagnetic radiation projected by point location on the projected pattern; and
wherein using a digital pixel-based projection system includes using a micro-mirror projection device that reflects electromagnetic radiation onto the substrate from a light source.

15. The method of claim 12, wherein the patterning film includes a photo acid generator; and
wherein projecting the pattern of electromagnetic radiation onto the patterning film causes photo acid to form in the patterning film according to the pattern of electromagnetic radiation.

16. The method of claim 12, wherein projecting the pattern of electromagnetic radiation onto the patterning film is selectively executed either prior to a mask-based lithographic exposure or subsequent to mask-based lithographic exposure.

17. The method of claim 12, wherein projecting the pattern of electromagnetic radiation includes projecting light onto the surface of the substrate via a digital light processing (DLP) device; and
wherein the digital light processing device is configured to vary a light intensity of each independently addressable pixel.

18. A method for patterning a substrate, the method comprising:
identifying a critical dimension signature that spatially characterizes critical dimension values of structures on substrates corresponding to a substrate to be processed according to a predetermined pattern;

calculating an image based on the critical dimension signature to compensate for at least one critical dimension value for at least one structure deviating from a predetermined critical dimension value for the at least one structure and thereby form the predetermined pattern;

projecting the image onto a patterning film deposited on the substrate, the image being projected as a pattern of electromagnetic radiation and generated using a digital pixel-based projection system having an array of independently addressable projection points that are selectively addressed to form the projected pattern, the pattern of electromagnetic radiation causing a first solubility shift in the patterning film; and executing a reticle-based photolithographic exposure process, the reticle-based photolithographic exposure process causing a second solubility shift in the patterning film, the first solubility shift and the second solubility shift combined defining a latent pattern in the patterning film in that the latent pattern comprises portions of the patterning film that are soluble to a given developer.

19. The method of claim 18, wherein executing the reticle-based photolithographic exposure process occurs subsequent to projecting the image onto the patterning film using the digital pixel-based projection system.

20. The method of claim 18, wherein executing the reticle-based photolithographic exposure process occurs prior to projecting the image onto the patterning film using the digital pixel-based projection system.

* * * * *